US 6,618,261 B1

(12) United States Patent
Gaboury et al.

(10) Patent No.: US 6,618,261 B1
(45) Date of Patent: Sep. 9, 2003

(54) ELECTRICAL SENSOR MOUNT

(75) Inventors: Scott Howard Gaboury, Ann Arbor, MI (US); Steven Yellin Schondorf, Dearborn, MI (US); David James Tippy, Farmington Hills, MI (US); Paul Kevin Kula, Farmington Hills, MI (US); Rene A. Najor, Farmington Hills, MI (US); Janak Chitalia, Westland, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 10/161,899

(22) Filed: Jun. 4, 2002

(51) Int. Cl.⁷ .............................. H05K 5/00; H05K 5/04; H05K 5/06
(52) U.S. Cl. ...................... 361/752; 361/753; 361/796; 361/760; 361/761; 361/785; 361/769
(58) Field of Search ................... 361/752, 753, 361/796, 760, 761, 785, 765, 764, 769, 773–774, 789, 790, 735, 792, 828, 832

(56) References Cited

U.S. PATENT DOCUMENTS

| | | | |
|---|---|---|---|
| 4,150,371 A | 4/1979 | Scaglione | |
| 5,072,213 A | 12/1991 | Close | |
| 5,144,516 A | * | 9/1992 | Sham .......................... 361/49 |
| 5,341,124 A | 8/1994 | Leyden et al. | |
| 6,049,286 A | 4/2000 | Forr | |
| 6,087,939 A | 7/2000 | Leyden et al. | |
| RE36,886 E | * | 10/2000 | Ishibashi et al. ............... 385/92 |
| 6,442,027 B2 | * | 8/2002 | Sanada et al. ............... 361/704 |

* cited by examiner

*Primary Examiner*—David Martin
*Assistant Examiner*—Thanh Yen Thanh
(74) *Attorney, Agent, or Firm*—Frank A. MacKenzie

(57) ABSTRACT

A sensor mount assembly including a housing, fastener and a lever mechanism. The housing contains a sensor having two electrical leads and includes an integral flange adapted to receive a fastener. The fastener includes a body and a head. The body is received in the flange to secure the housing to a mount. The lever mechanism is proximate the flange and includes a contact block and a conductor. The contact block is acted upon by the fastener head to move the lever mechanism and, hence the conductor, between a first position and a second position. The first position corresponds to an unmounted sensor and creates a short circuit condition between the two electrical leads. The second position corresponds to a properly mounted sensor and creates an open circuit between the two electrical leads such that the electrical circuit path of the overall system includes the sensor within the housing.

16 Claims, 2 Drawing Sheets

ELECTRICAL SENSOR MOUNT

TECHNICAL FIELD

The present invention relates to a sensor mount for ensuring the proper connection for an electrical sensor.

BACKGROUND OF THE INVENTION

Automotive safety systems typically employ numerous sensors to detect potential vehicle safety threats and deploy vehicle safety counter measures in reaction to a safety threat or a detected collision event. For example, it is common to use accelerometers to sense vehicle impact and deploy air bags and/or seatbelt pretensioners or other safety-related devices in response thereto. In some vehicle safety systems, the impact sensors, i.e., accelerometers, are located within a centrally located control system. In order to provide reliable acceleration data, impact sensors must be rigidly fixed to the vehicle body part of interest such that reactions upon the vehicle body part can be accurately translated into acceleration data for use by the vehicle safety system.

Accelerometers and impact sensors are typically rigidly affixed to the vehicle by bolts, screws, rivets and the like. Presently, the integrity of the sensor mounting is typically insured by quality control measures with respect to the attachment mechanism. In other words, great care is taken to make sure that the bolt, screw, rivet or solder which attaches the sensor to the vehicle is properly secured or executed. The obvious drawback of monitoring the sensor mount at the time of assembly is that the integrity of the sensor mount can degrade over time. For example, bolts can come loose, clips can break, and solders can crack under certain vehicle operating conditions. Another drawback to monitoring only the attachment process at the time of attachment is that human, machine, or robotic errors could occur in the process itself or in the monitoring process and proper attachment might not occur.

Thus, to ensure the ongoing integrity of the sensor mount, some vehicle manufacturers pass current through the attachment mechanism, i.e., the attaching bolt, to create an electrical circuit which can be monitored to ensure the integrity of the sensor mount. One drawback with such a monitoring scheme, however, is that a loose bolt or rivet can sufficiently maintain the electrical monitoring circuit connection, yet fail to rigidly affix the sensor to the vehicle. This can result in potentially corrupt sensor data in view of a false belief that the sensor is properly attached. This is because the conduction of electrical current is not a direct measurement of the attachment force or integrity. Another drawback is that the electrical current monitoring scheme can be impossible to use if the body part of interest is made of non-conductive material which is becoming more prevalent with the increased use lightweight composite material in automotive designs. In such cases, it would be necessary to add a conductive bracket to the sensor and attach the bracket to a conductive structure of the vehicle. This adds unnecessary weight, cost and complexity. Another drawback with such a sensor mount monitoring scheme is that as additional impact sensors are used at various locations throughout the vehicle, such as in the doors and front and rear fascias, the expense of the monitoring scheme becomes undesirable.

Accordingly, there is a need for an improved sensor-mounting assembly which provides a robust sensor connecting mechanism and ensures the continuous integrity of the sensor mount.

SUMMARY OF THE INVENTION

The present invention provides an improved electrical sensor mount which overcomes the drawbacks associated with present sensor mounting schemes. A sensor mount assembly including a housing, fastener and a lever mechanism is provided. The housing contains a sensor having two electrical leads and includes an integral flange adapted to receive a fastener. The fastener includes a body and a head. The fastener body is received in the flange to secure the housing to a mount. The lever mechanism is proximate the flange and includes a contact block and a conductor. The contact block is acted upon by the fastener head to move the lever mechanism and, hence the conductor, between a first position and a second position. The first position corresponds to an unmounted sensor and creates a short circuit condition between the two electrical leads. The second position corresponds to a properly mounted sensor and creates an open circuit between the two electrical leads such that the electrical circuit path of the overall system includes the sensor within the housing.

In one embodiment, the lever mechanism includes a lever ring positioned about the fastener body between the fastener head and an upper surface of the flange. The lever ring includes a conductive bar passing within the housing. The lever ring is acted upon by the fastener head and the upper surface to be moveable between a first position wherein the conductive bar is in electrical contact with the two electrical leads to create a short circuit, and a second position wherein the conductive bar creates an open circuit with respect to the two electrical leads.

In another embodiment, the lever mechanism includes a split flange design wherein each portion of the flange includes an electrical contact associated with a respective electrical lead within the housing. Securing the fastener within the mount forces the two flange portions and, hence, the electrical contacts therein, together to create a short circuit between the two electrical leads.

The present invention is advantageous in that it provides an inexpensive, robust electrical sensor-mounting scheme. Other advantages and features of the invention will become apparent to one of skill in the art upon reading the following detailed description in connection with the drawings illustrating features of the invention by way of example.

BRIEF DESCRIPTION OF THE DRAWINGS

For a more complete understanding of this invention, reference should now be made to the embodiments illustrated in greater detail in the accompanying drawings and described below by way of examples of the invention.

In the drawings.

DETAILED DESCRIPTION OF THE INVENTION

While the present invention is described with respect to an assembly for an electrical sensor mount, the present invention may be adapted and utilized for other attachment mechanisms wherein the integrity of an electrical circuit at the connection must be insured.

In the following description, various operating parameters and components are described for one constructed embodiment. These specific parameters and components are included as examples and are not meant to be limiting.

Figure 1:
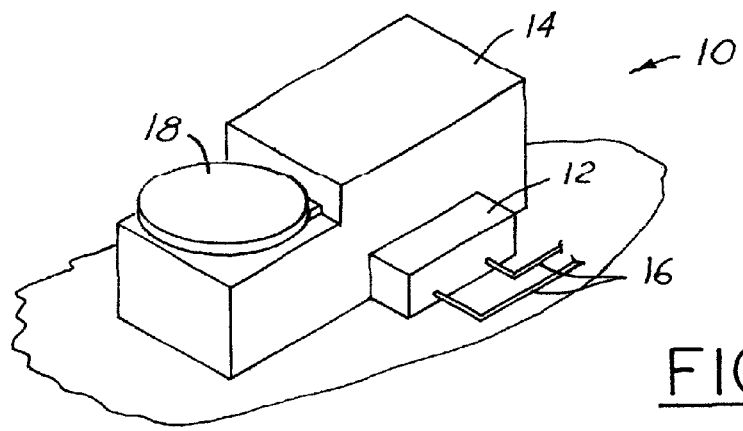
FIG. 1 is an isometric view of a sensor mount assembly in accordance with one embodiment of the present invention.

Referring now to the drawings wherein like reference numerals are used to identify identical components in the various views, FIG. 1 illustrates an isometric view of a sensor mount assembly 10 in accordance with one embodiment of the present invention. The assembly 10 is used for mounting a sensor which provides a signal by way of an electrical circuit. A connector 12 carries the signals from the sensor within the housing 14 to the system controller or other device by way of electrical leads 16. The assembly 10 includes the housing 14 and fastener 18 which interacts with a lever mechanism as described in more detail below with references to FIGS. 2 and 3 to ensure the integrity of the sensor connection such that the data provided by the sensor is reliable and accurate.

Figure 2:
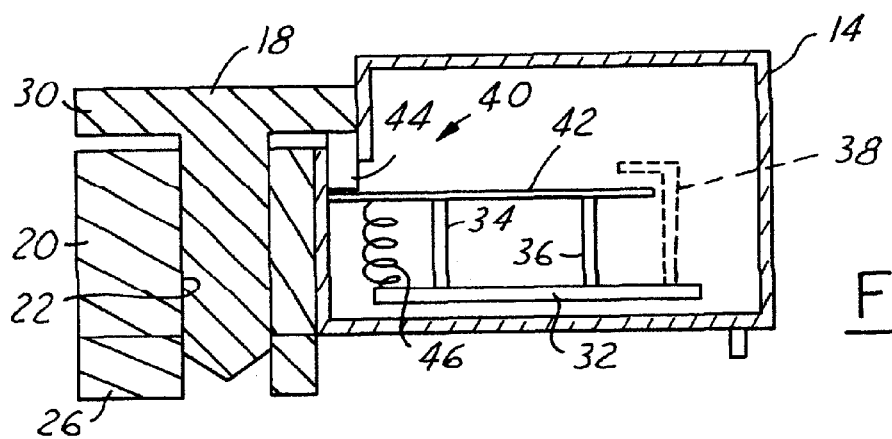
FIG. 2 is a side sectional view of the sensor mount of FIG. 1 with the fastener in the unmounted position.
Figure 3:
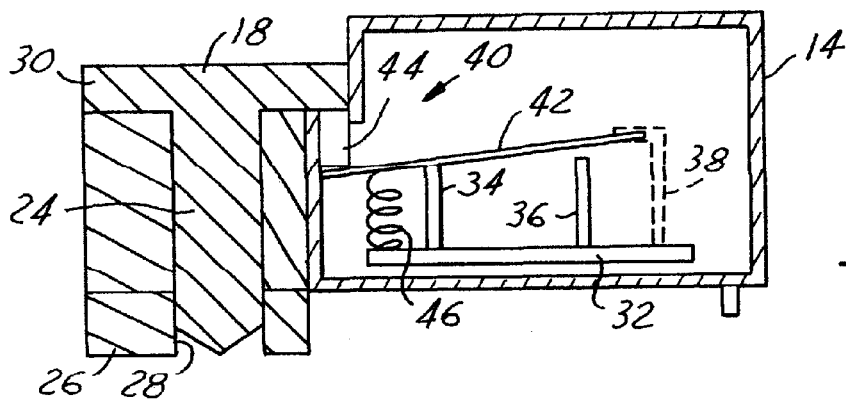
FIG. 3 is a side sectional view according to FIG. 2 with the fastener head in the mounted position.

Referring now to FIGS. 2 and 3, there are shown side sectional views of the assembly of FIG. 1 with the fastener 18 in a first, unmounted position and second, mounted position. As can be seen in FIGS. 2 and 3, the housing 14 includes an integral flange 20 having a central bore 22 for receiving the body 24 of the fastener 18. In one embodiment, the central bore 22 and the fastener body 24 are threaded such that the fastener body 24 and flange 20 engage with one another. Fastener 18 operating through the flange 20 engages the mount 26 to which the sensor assembly is to be fixedly attached. For example, the mount 26 may be a weld nut fixed to an exterior panel of a vehicle door such that the assembly when fixed thereto represents a device for collecting side impact sensor data for the vehicle safety systems. In a preferred embodiment, the mount 26 includes a threaded opening 28 for inter-engaging with the threaded body 24 of the fastener 18. In such a case, the flange central bore 22 may be likewise threaded or unthreaded.

The fastener 18 also includes a head 30 which seats against the upper portion of the flange 20 when it is in the fully seated or attached position as shown in FIG. 3. The fastener 18 may be a cap screw, torx-headed fastener, flat-headed or Phillips-headed screw, or any other fastener which is used to hold an object against another object or body by way of the fastener head. Plastic, push-type fasteners may also be used. The present invention also contemplates the use of a washer between the flange 20 and fastener head 30 to perform the same function as the fastener head 30 with respect to the lever mechanism as described herein. Thus, the term fastener head includes a washer performing the same function.

The sensor housing 14 surrounds and houses the sensor which is represented as circuit board 32 in FIGS. 2 and 3. The connector 12 of FIG. 1 interfaces with the sensor 32 and the electrical leads 16 communicate the sensor signals to a central system (not shown). The conductor pins 34, 36 are used in cooperation with the bar 42 to provide a short-circuit conductive path around the sensor circuit when in the unmounted state. An alternative arrangement for conductor pin 36 is shown in hidden lines as conductor pin 38. The alternate pin arrangement can be used depending upon whether an open circuit or short circuit condition represents the desired sensor mount.

The lever mechanism 40 includes a conductive shorting bar 42 which, in the unmounted state shown in FIG. 2 creates a short circuit between the conductor pins 34, 36. A contact block 44 is configured within the wall of the housing 14 adjacent the flange 20 to provide translational movement corresponding to the seating of the fastener head 30 against the flange 20 and, in response, react upon the shorting bar 42 to create an open circuit condition between the conductor pins 34, 36 when the fastener is fully seated as shown in FIG. 3. A spring bias 46 acts upon the same end of the shorting bar as the contact block 44, but in the opposite direction to maintain the short circuit condition until the fastener 18 is fully seated within its mount 26. In the short circuit condition, the sensor 32 is unable to provide any data on the leads 16 as the electrical connection between the leads 16 appears as a short circuit. When the fastener 18 is in its second, fully seated position within the mount 26, the shorting bar creates an open circuit condition between the two conductor pins 34, 36 and thereby allows the sensor 32 to become part of the circuit between the leads 16. In the event that the fastener should come loose, the contact block 44 will be pushed upwards by the spring bias 46 resulting in the shorting bar 42 again closing the circuit between the conductor pins 34, 36 creating a short circuit connection at the sensor location which can be readily detected by the control system receiving the sensor signal.

Figure 4:
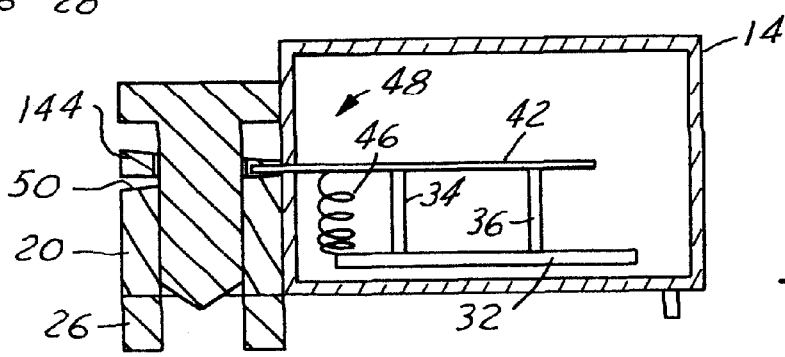
FIG. 4 is a side sectional view of a sensor mount in accordance with another embodiment of the present invention with the fastener head in an unmounted position.
Figure 5:
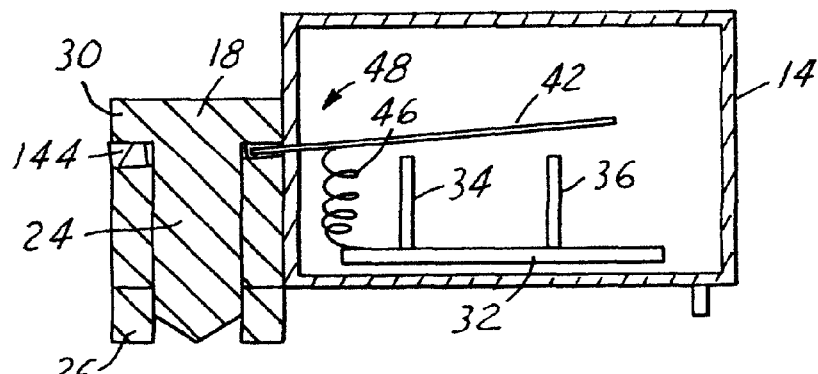
FIG. 5 is a side sectional view of a sensor mount of FIG. 4 with the fastener head in a mounted position.

Referring now to FIGS. 4 and 5, there are shown side sectional views of an assembly for mounting a sensor in accordance with another embodiment of the present invention. In the example of FIGS. 4 and 5, the lever mechanism 48 differs in that the contact block 144 is ring-shaped similar to a washer and the shorting bar 42 is molded or fixed therein. The upper portion 50 of the flange 20 is angled downward away from the housing such that as the head 30 of the fastener 18 is driven into the mount 26, the upper portion 50 of the flange 20 and the contact block in the form of the ring 144 acts as a lever to lift the shorting bar 42 away from the conductor pins 34, 36. The ring 144 may have a complimentary wedge shape as shown to improve the lever action as the fastener moves from its first position (FIG. 4) to its second position (FIG. 5).

Figure 6:
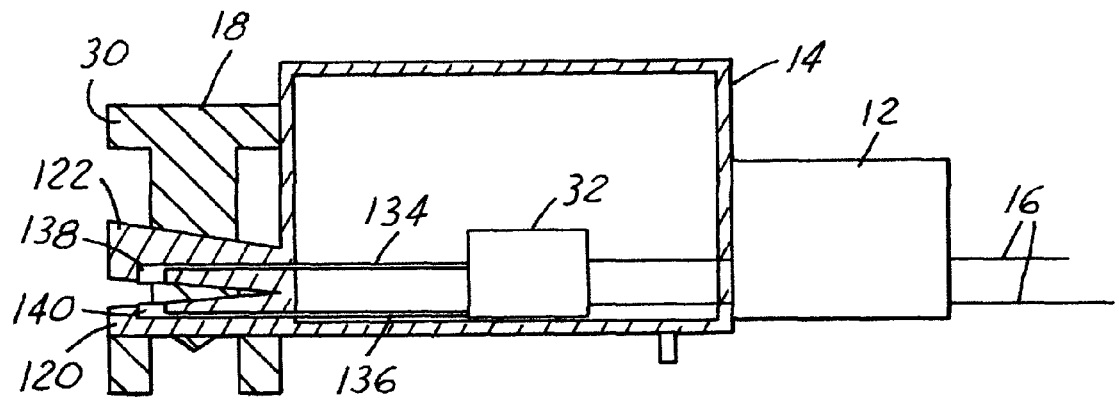
FIG. 6 is a side sectional view of an electrical sensor mount in accordance with another embodiment of the present invention with the fastener head in an unmounted position.
Figure 7:
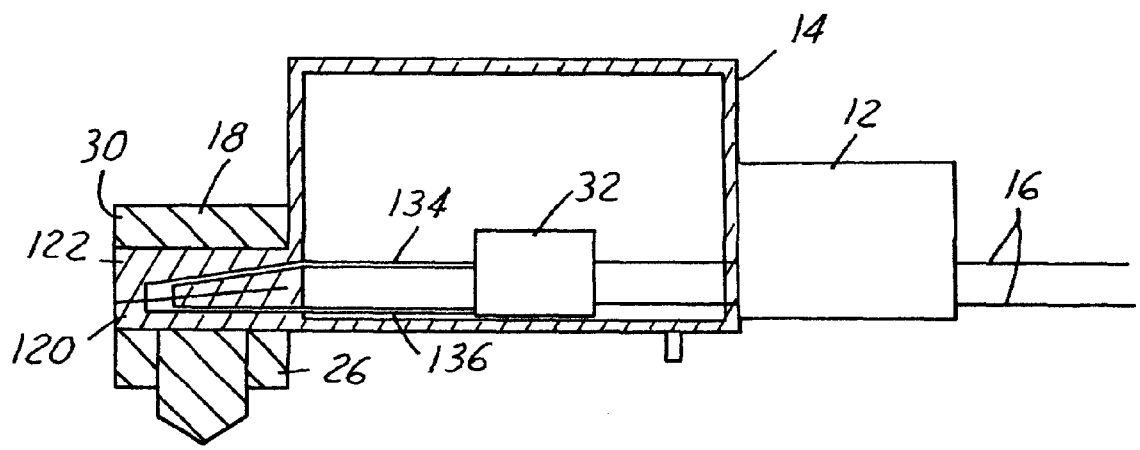
FIG. 7 is a side sectional view according to FIG. 6 with the fastener head in a mounted position.

Referring now to FIGS. 6 and 7, there are shown side sectional views of another embodiment of a sensor mount assembly in accordance with the present invention. In this example, the connector 12 is shown to the side of the housing 14 with the leads 16 terminating into the sensor 32 and the conductor pins 134, 136 terminating in a split flange having an upper lower portion 122, 120 and containing conductor pads 138, 140, respectively.

In operation, as the fastener 18 is driven into the mount 26, the head 30 of the fastener 18 acts upon the upper flange 122 to bring it together with the lower flange 120 and thereby close the circuit between conductor pins 134, 136 by way of the conductor pads 138, 140. In this case, the conductor leads 134, 136 are used to indicate to the sensor circuit 32 that a proper mount has been established. Thus, depending upon the sensor circuit 32, either an open circuit (FIGS. 1–5) or short circuit (FIGS. 6 and 7) may be used to indicate a proper sensor mount depending upon the particular requirements of the application. The alternate conductor pin 38 of FIGS. 2 and 3 could likewise be used instead of conductor pin 36 if a short circuit condition was desired to indicate a proper sensor mount.

The assembly for mounting an electrical device disclosed herein is advantageous in that it provides a mechanism for continuous monitoring of the integrity of the sensor mount. The mounting scheme also provides a great degree of design freedom for the materials of the component parts. For example, the housing, flange, fastener, and mount can all be constructed of plastic or metal. The shorting bar, conductor pads, and conductor pins, however, are preferably constructed of electrically conductive material such as copper, aluminum, silver or gold, or the like.

From the foregoing, it can be seen that there has been brought to the art a new and improved sensor mount assembly which has advantages over prior sensor mounting schemes. While the invention has been described in connection with one or more embodiments, it should be understood that the invention is not limited to those embodiments. On the contrary, the invention covers all alternatives, modifications and equivalents as may be included within the spirit and scope of the appended claims.

What is claimed is:

1. An assembly for mounting an electrical device comprising:
   a housing containing an electrical device having at least two electrical leads, the housing comprising an integral flange adapted to receive a fastener;
   a fastener comprising a body and a head, the body being received in said flange to secure said housing to a mount; and
   a lever mechanism proximate said flange and comprising a contact block and a conductor, the lever mechanism being adapted to be acted upon said head, to be moveable between a first position wherein said conductor creates a short circuit between said at least two electrical leads and a second position wherein said conductor creates an open circuit between said at least two electrical leads.

2. An assembly according to claim 1 wherein said first position corresponds to said fastener head in a mounted position.

3. An assembly according to claim 1 wherein said second position corresponds to said fastener head in a mounted position.

4. An assembly according to claim 1 wherein said fastener body and said mount comprise inter-engaging threads and wherein said lever mechanism moves between said first and second positions in response to said fastener body being threaded into said mount.

5. An assembly according to claim 4 wherein said contact block linearly translates along a wall of said housing in response to said fastener body being threaded into said mount.

6. An assembly according to claim 4 wherein said contact block comprises a wedge-shaped ring on said flange and circumjacent said fastener body, wherein said ring cooperates with an upper surface of said flange and said fastener head in response to said fastener body being threaded into said mount.

7. An assembly according to claim 1 wherein said mount comprises a weld nut.

8. An assembly according to claim 1 wherein said lever mechanism is biased toward said first position.

9. An assembly according to claim 1 wherein said lever mechanism is biased toward said second position.

10. An assembly according to claim 1 wherein said housing and said flange are comprised of plastic.

11. A sensor mount assembly comprising:
    a housing containing a sensor having two electrical leads, the housing having an integral flange adapted to receive a fastener;
    a fastener comprising a body and a head, the body being received in said flange to secure said housing to a mount; and
    a lever ring positioned about said fastener body between said fastener head and an upper surface of said flange, the lever ring comprising a conductive bar passing within said housing, the lever ring being acted upon by said fastener head and said upper surface to be moveable between a first position wherein said conductive bar is in electrical contact with said two electrical leads to create a short circuit and a second position wherein said conductive bar creates an open circuit with respect to said two electrical leads.

12. An assembly according to claim 11 wherein said second position corresponds to said fastener being seated within said mount.

13. An assembly according to claim 11 comprising a spring biasing said conductive bar away from said electrical leads.

14. An assembly according to claim 11 wherein said mount and said fastener body comprise inter-engaging threads.

15. An assembly according to claim 11 wherein said flange upper surface is angled downward and away from said housing.

16. An assembly according to claim 11 wherein said housing and said flange are comprised of plastic.

* * * * *